United States Patent
Heidemann et al.

(10) Patent No.: US 10,014,448 B2
(45) Date of Patent: Jul. 3, 2018

(54) PHOSPHOR CONVERTED LED WITH TEMPERATURE STABLE FLUX AND SATURATED RED COLOR POINT

(71) Applicant: KONINKLIJKE PHILIPS N.V., Eindhoven (NL)

(72) Inventors: Matthias Heidemann, Aachen (DE); Hans-Helmut Bechtel, Aachen (DE); Christoph Martiny, Aachen (DE); Peter Josef Schmidt, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/521,438

(22) PCT Filed: Oct. 28, 2015

(86) PCT No.: PCT/EP2015/074978
§ 371 (c)(1),
(2) Date: Apr. 24, 2017

(87) PCT Pub. No.: WO2016/066683
PCT Pub. Date: May 6, 2016

(65) Prior Publication Data
US 2017/0331012 A1 Nov. 16, 2017

(30) Foreign Application Priority Data
Oct. 31, 2014 (EP) .................................. 14191304

(51) Int. Cl.
*H01L 33/50* (2010.01)
*C09K 11/77* (2006.01)
(Continued)

(52) U.S. Cl.
CPC ........ *H01L 33/504* (2013.01); *C09K 11/7731* (2013.01); *C09K 11/7734* (2013.01);
(Continued)

(58) Field of Classification Search
CPC ............. H01L 33/504; C09K 11/7731; C09K 11/7734; C09K 11/7774; C09K 11/883; H05B 33/12
See application file for complete search history.

(56) References Cited

U.S. PATENT DOCUMENTS

2008/0036364 A1  2/2008  Li et al.
2013/0240943 A1  9/2013  Schmidt et al.

FOREIGN PATENT DOCUMENTS

DE  102012110552 A1  5/2014
EP      2048718 A1  4/2009
(Continued)

OTHER PUBLICATIONS

EPO as ISA, "International Search Report and Written Opinion" dated Jan. 8, 2016 from International Application No. PCT/EP2015/074978, filed Oct. 28, 2015, 16 pages.
(Continued)

*Primary Examiner* — Thomas M Sember

(57) ABSTRACT

The invention provides a lighting device configured to provide red lighting device light, the lighting device comprising: (i) a first light source configured to provide first light source light having a peak wavelength ($\lambda s$); (ii) a first red luminescent material configured to absorb at least part of the first light source light and to convert into first red luminescent material light having a first red emission peak wavelength ($\lambda m1$), the first red luminescent material having an excitation maximum ($\lambda x1$); (iii) a second red luminescent material configured to absorb at least part of the first light source light and to convert into second red luminescent material light having a second red emission peak wavelength ($\lambda m2$), the second red luminescent material having a second excitation maximum ($\lambda x2$); and wherein the first luminescent material and the second luminescent material are Eu2+ based, and wherein $\lambda m1 < \lambda m2$, $\lambda x1 < \lambda s$ and $\lambda x2 > \lambda s$.

20 Claims, 5 Drawing Sheets

(51) Int. Cl.
*C09K 11/88* (2006.01)
*H05B 33/12* (2006.01)

(52) U.S. Cl.
CPC ........ *C09K 11/7774* (2013.01); *C09K 11/883* (2013.01); *H05B 33/12* (2013.01)

(56) References Cited

FOREIGN PATENT DOCUMENTS

| | | |
|---|---|---|
| EP | 2428543 A1 | 3/2012 |
| EP | 2650934 A1 | 10/2013 |
| WO | 2006072918 A1 | 7/2006 |
| WO | 2006106467 A1 | 10/2006 |
| WO | 2013175336 A1 | 11/2013 |

OTHER PUBLICATIONS

Philipp Pust et al., "Narrow-band Red-emitting Sr{LiAl3N4}:Eu2+ as a next-generation LED-phosphor material", Nature Materials, vol. 13, No. 9, Jun. 22, 2014, pp. 891-896.
Martin Zeuner, "Molekulare Precursoren und neue Synthesestrategien zu Nitridosilicaten und deren Verwendung fur phosphor-konvertierte LEDs", Dissertation zur Erlangung des Doktorgrades, Jan. 1, 2009, pp. 101-102.
Extended European Search Report dated Sep. 22, 2015, European Application No. 14191304.6, 10 pages.

US 10,014,448 B2

PHOSPHOR CONVERTED LED WITH TEMPERATURE STABLE FLUX AND SATURATED RED COLOR POINT

CROSS-REFERENCE TO RELATED APPLICATIONS

The present application is a § 371 application of International Application No. PCT/EP2015/074978 filed on Oct. 28, 2015 and entitled "PHOSPHOR CONVERTED LED WITH TEMPERATURE STABLE FLUX AND SATURATED RED COLOR POINT", which claims the benefit of European Patent Application No. 14191304.6 filed on Oct. 31, 2014. International Application No. PCT/EP2015/074978 and European Patent Application No. 14191304.6 are incorporated herein.

FIELD OF THE INVENTION

The invention relates to a lighting device configured to provide red light. The invention also relates to a lighting unit comprising such lighting device. Further, the invention relates to a light converter for use in such lighting device.

BACKGROUND OF THE INVENTION

Red luminescent materials are known in the art; red emitting LEDs (light emitting diodes) are also known in the art, and are for instance described in WO2006106467. WO2006106467 describes a light emitting device comprising: a light emitting diode (LED) portion comprising: a first $(Al_xGa_{1-x})_{1-y}In_yP$ epitaxial layer of a first conductivity type formed on a growth layer, the growth layer having a lattice constant greater than that of GaAs; an active layer epitaxially grown over the first $(Al_xGa_{1-x})_{1-y}In_yP$ epitaxial layer, wherein the active layer comprises one or more layers of material comprising any combination of Al, Ga, In, and P, such that the active layer has a lattice constant greater than the lattice constant of GaAs and approximately equal to the lattice constant of the growth layer, and wherein the active layer emits visible light; and a second epitaxial layer of a second conductivity type grown over the active layer. The visible light is especially red light.

SUMMARY OF THE INVENTION

As indicated above, direct emitting LEDs (AlInGaP) can be used to provide red light. However, it appears that such direct emitting LEDs have a temperature behavior in terms of color point stability and lumen output which is less than desirable in certain applications. On the other hand, blue LEDs can be used to generate red light in combination with a red luminescent material. However, also these red luminescent materials appear to display a wavelength shift as function of the temperature. Such wavelength shift of the red luminescent material is again in general less desirable.

Hence, it is an aspect of the invention to provide an alternative lighting device, which preferably further at least partly obviates one or more of above-described drawbacks, and which may provide emission in the red that is substantially temperature independent (i.e. substantially independent of the temperature of the pump light source (see below) and/or of the temperature of the red luminescent material). It is also an aspect of the invention to provide an alternative lighting unit (comprising such lighting device), which preferably further at least partly obviates one or more of above-described drawbacks. Yet it is also an aspect of the invention to provide an alternative light converter (for use in a lighting device), which preferably further at least partly obviates one or more of above-described drawbacks.

Hence, in a first aspect the invention provides a lighting device configured to provide red lighting device light, the lighting device comprising: (i) a first light source configured to provide first light source light having a peak wavelength ($\lambda$ls), (ii) a first red luminescent material (herein also indicated as "first luminescent material" or "first phosphor") configured to absorb at least part of the first light source light and to convert into first red luminescent material light having a first red emission peak wavelength ($\lambda$m1), the first red luminescent material having an excitation maximum ($\lambda$x1), (iii) a second red luminescent material (herein also indicated as "second luminescent material" or "second phosphor") configured to absorb at least part of the first light source light and to convert into second red luminescent material light having a second red emission peak wavelength ($\lambda$m2), the second red luminescent material having a second excitation maximum ($\lambda$x2); wherein the first luminescent material and the second luminescent material are $Eu^{2+}$ based, and wherein $\lambda m1 < \lambda m2$, $\lambda x1 < \lambda ls$ and $\lambda x2 > \lambda ls$. The combination of the first red luminescent material and the second red luminescent material is herein also indicated as "converter" (even though in embodiments these luminescent materials may be configured remote from each other).

With such lighting device red light ("red lighting device light") can be generated that substantially stays at the same color point in a temperature range of 20-120° C. For instance, the centroid wavelength $$(CW)CW = \frac{\int_{-\infty}^{\infty} \lambda \cdot I(\lambda) d\lambda}{\int_{-\infty}^{\infty} I(\lambda) d\lambda}$$

and/or color point may shift over this range with less than 10% of the value(s) at 20° C. With the present invention, the emission wavelength (especially indicated as centroid wavelength) may change over the indicated temperature range (of 20-120° C.) with e.g. about 2 nm, whereas for AlInGaP LEDs this would be in the range of about 5 nm. Further, the intensity in terms of relative luminous flux (i.e. flux at a temperature T divided by the flux emitted at a temperature of 20° C. (in lumen (Lm)) may decrease for such AlInGaP LED in the range of about 50% over the indicated temperature range, whereas with the present invention the relative flux may stay substantially the same.

Hence, especially the invention provides a combination of two (or more) red luminescent materials, one having a shorter wavelength emission maximum than the other, and both having an excitation maximum close to the light source emission, but the first luminescent material having an excitation maximum at a wavelength shorter than the emission maximum of the light source, and the second luminescent material having an excitation maximum at a wavelength longer than the emission maximum of the light source. The maxima described here relate to the peak wavelengths.

The first light source will especially comprise a LED light source. In general, a LED light source only has a single emission peak, i.e. the maximum of the LED emission. Further, the divalent europium based luminescent materials are substantially broad band emitters, with in the present invention at least having intensity in the red part of the spectrum. The corresponding excitation bands are at shorter wavelengths (than these emissions (in the red)), and have excitation maxima close to the emission maximum of the first light source. The excitation and emission band of the divalent europium materials show a Stokes shift. The peak maxima of these (excitation and emission) bands are the herein indicated excitation maximum and emission maximum.

Especially, emission spectra are measured in a photon counting mode (e.g. with a photomultiplier) or are converted to a photon counting mode. After correction for the wavelength dependence of the response of the measurement device, the emission peak wavelengths can be determined. At those maxima, the excitation spectra of the luminescent materials may be measured. After correction for the wavelength dependence of the excitation part of the measurement device, the excitation peak wavelengths can be determined. This is known to a person skilled in the art. The characteristic peak maxima ($\lambda m1$, $\lambda m2$, $\lambda x1$, $\lambda x2$, and $\lambda ls$) are especially determined at 20° C. This may for instance imply that the LED light source as first light source is, for the determination of the peak maximum, not at full power.

The term "first red luminescent material" and "second red luminescent material" may each independently also refer to a plurality of different "first red luminescent materials" and/or "second red luminescent materials", respectively. The differences can be due to only a difference in dopant concentration, i.e. especially the $Eu^{2+}$ concentration, but additionally or alternatively also to differences in lattice compositions, such as different M cations (see also below) and/or different anions. As known in the art, within a class of materials the emission and/or excitation of dopants like $Eu^{2+}$ can be tuned by controlling the type and amount of cations and anions. However, each first red luminescent material and each second red luminescent material has to comply with the herein indicated conditions for the red luminescent materials.

It appears that divalent europium doped systems (i.e. the divalent europium ($Eu^{2+}$) based luminescent materials), especially (oxy)nitrides are very suitable for the present invention, as these luminescent materials tend to have a decreasing emission peak wavelength with increasing temperature. When using two different divalent europium based luminescent materials, the wavelength shift (to longer wavelengths) of the first light source, especially the LED light source, can be compensated. Surprisingly, this compensation can nearly be 100% in terms of relative flux within the temperature range of 20-120° C.

The red luminescent materials are configured to absorb (at least part of) the first light source light. Hence, this light is used as excitation light. This may especially imply that the respective excitation curves will at least partially overlap with the first light source emission curve. Especially, the first light source and the red luminescent materials are selected to provide light source light having an emission wavelength distribution and respective excitation spectra having excitation wavelength distributions, wherein the respective latter two substantially overlap with the emission wavelength distribution. The first light source light may e.g. comprise one or more of UV, blue, green, and yellow light. Especially, the first light source light comprises one or more of blue, green, and yellow light. In a specific embodiment, the first light source light comprises blue light. In an embodiment, the term "first light source" may refer to a plurality of light sources.

The lighting device as such is especially configured to provide red light. Optionally, the lighting device light may include some remaining (i.e. unconverted) light source light. The lighting device light thus essentially consists of the first red emission and the second red emission and optionally the first light source light. Note that the red luminescent materials may in embodiments also emit in the yellow and/or orange. The centroid wavelength of the red lighting device light, at least at wavelengths in the range of 470-700 nm, is however in the red part of the visible spectrum. In embodiments, the light source light contribution, such as a blue contribution, to the red lighting device light may (substantially) be smaller in terms of peak height (such as a first light source emission peak height less than 20% of the peak height of the first and/or second red luminescent material emission).

The condition $\lambda m1 < \lambda m2$ may for instance especially indicate that $\lambda m2 - \lambda m1 \geq 10$ nm, such as $\lambda m2 - \lambda m1 \geq 15$ nm, like $\lambda m2 - \lambda m1 \geq 20$ nm. Especially however, $\lambda m2 - \lambda m1 \leq 60$ nm.

The condition $\lambda x1 < \lambda ls$ may for instance especially indicate that $5 \text{ nm} \leq \lambda ls - \lambda x1 \leq 25$ nm. Likewise, the condition $\lambda x2 > \lambda ls$ may for instance indicate that $5 \text{ nm} \leq \lambda x2 - \lambda ls \leq 25$ nm. With such conditions, the wavelength shift of the light source compensates the wavelength shift of the luminescent materials and a color change and/or flux change as function of the temperature may be low or even substantially zero.

In a specific embodiment, $\lambda ls$ is selected from the range of 430-470 nm, $\lambda m1$ is selected from the range of 590-630 nm, and $\lambda m2$ is selected from the range of 615-660 nm. Even though these emission ranges overlap, the luminescent materials should comply with the condition of $\lambda m1 < \lambda m2$. For instance, the maximum peak emissions may be at 610 and 640 nm, respectively, but may optionally also at 620 and 645 nm, respectively, etc. Hence, in a specific embodiment the light source is configured to provide blue first light source light. More especially, $\lambda ls$ is selected from the range of 435-465 nm, $\lambda m1$ is selected from the range of 590-630 nm, such as 600-630 nm, and $\lambda m2$ is selected from the range of 615-660 nm, such as 625-660 nm.

Luminescent materials of specific interest are inorganic luminescent materials, even more especially (independently) selected form the classes of sulfides, nitrides and oxynitrides.

A class of relevant luminescent materials include the MD:Eu class (herein also indicated as the (Sr,Ba,Ca)(Se,S):Eu class), which is the class of alkaline earth chalcogenide systems. M is especially selected from the group of earth alkaline elements (Mg, Ca, Sr, Ba), and D is especially selected from the group of S and Se. The materials within this class have a cubic rock salt crystal structure. Examples of members within this class are SrS:Eu, CaS:Eu, CaSe:Eu, etc.

A further class of relevant luminescent materials includes the $M_2Z_5N_8$:Eu class (herein also indicated as the $Sr_2Si_5N_8$:Eu class), which is the class of nitridosilicate systems. M is especially selected from the group of earth alkaline elements (Mg, Ca, Sr, Ba), especially at least Sr, and Z is especially selected from the group of Si, Ge, Ti, Hf, Zr, Sn, especially at least Si. The materials within this class have an orthorhombic crystal structure. An example of a member within this class is $SrCaSi_5N_8$:Eu.

Another class of relevant luminescent materials includes the $MGB_3N_4$:Eu class (herein also indicated as the $SrLiAl_3N_4$:Eu class), which is the class of nitridoaluminate systems. B is especially selected from the group of B, Al, Ga, Sc, especially at least Al, and G is especially selected from the group of alkaline elements (such as Li, Na, K, etc.), especially at least Li. The materials within this class have a triclinic potassium lithium plumbate type crystal structure or a tetragonal sodium lithium silicate type crystal structure. An example of a member within this class is SrLiAl$_3$N$_4$:Eu.

In yet a more specific embodiment, wherein especially good optical results may be obtained, the first red luminescent material and the second luminescent material are selected from the group consisting of the class of M$_2$Si$_5$N$_8$:Eu and the class of MLiAl$_3$N$_4$:Eu, wherein M is independently selected from the group consisting of Ca, Mg, Sr, and Ba, especially at least one or more of Ca and Sr, yet even more especially at least Sr.

The term "class" herein especially refers to a group of materials that have the same crystallographic structure. Further, the term "class" may also include partial substitutions of cations and/or anions. For instance, in some of the above-mentioned classes Al—O may partially be replaced by Si—N(or the other way around). Hence, in yet a further embodiment the first red luminescent material and the second red luminescent material are selected from the group consisting of (Ba,Sr,Ca)$_2$Si$_{5-x}$Al$_x$N$_{8-x}$O$_x$:Eu, wherein x is in the range of 0-4, especially equal to or lower than 1, such as 0, and (Ca,Sr)LiAl$_3$N$_4$:Eu. (Ba,Sr,Ca)$_2$Si$_{5-x}$Al$_x$N$_{8-x}$O$_x$:Eu and similar systems are amongst others described in WO2006072918/US20130240943, which are incorporated herein by reference. (Sr,Ca)LiAl$_3$N$_4$:Eu and similar systems are amongst others described in WO2013175336A1, which is incorparted herein by reference. In even yet a more specific embodiment, the first red luminescent material comprises (Sr,Ca)$_2$Si$_5$N$_8$:Eu, and the second red luminescent material comprises SrLiAl$_3$N$_4$:Eu. The luminescence behavior as function of the temperature is also shown in the accompanying drawings (FIGS. 2a and 2d).

The dopant concentration of Europium will in general be below 10% (of M), such as at least 5%, in general even below 4%. Further, in general the dopant concentration of Europium is larger than 0.01%, such as at least 0.15%. For instance, one might apply Ca$_{0.2}$Sr$_{1.785}$Eu$_{0.015}$Si$_5$N$_8$ (here the dopant concentration of Eu is 0.75%) and/or one might apply Sr$_{0.997}$Eu$_{0.003}$LiAl$_3$N$_4$ (here the dopant concentration is 0.3%). Further, the fact that the above indicated luminescent materials are indicated to be doped with europium (Eu) does not exclude the presence of co-dopants, such the Eu,Ce, wherein europium is co-doped with cerium, etc. Codoping is known in the art and is known to sometimes enhance the quantum efficiency and/or to tune the emission spectrum. As also indicated herein, the notation "(Sr,Ca)", and similar notations with other elements, indicates that the M-positions are occupied with Sr and/or Ca cations (or other elements, respectively).

The luminescent materials may independently or together be comprised by a powder layer, a film, a polymeric plate, a ceramic body, etc., The luminescent materials may independently or together in an embodiment be self-supporting, such as a ceramic luminescent body/bodies. Herein, the term ceramic body especially refers to a polycrystalline material that has been densified to a body (with low porosity).

In an embodiment, the luminescent materials may independently or together be comprised by a matrix, i.e. a matrix or matrices, wherein one or more the first luminescent material and the second luminescent material are embedded. Such matrix may be an inorganic matrix or an organic matrix or a hybrid matrix, such as a siloxane matrix. Also the term "matrix" may refer to a plurality of matrices. For instance, the first phosphor may be embedded in a first matrix and a second phosphor may be embedded in a second matrix, the two matrices forming a converter. When the luminescent materials are embedded in the matrix, the luminescent materials may especially be homogeneously distributed. This will also lead to the best light distribution of the device light. In another embodiment, the converter comprises a support comprising one or more coatings, wherein one or more of the coatings comprise one or more of the first luminescent material and the second luminescent material. Note that optionally a support may comprise the above-mentioned matrix. The configuration of the converter can be chosen to best cope with and make use of the temperature effects of the light source and/or the red luminescent materials.

In an embodiment, one or more of the luminescent materials are configured at a non-zero distance from the first solid state light source. In this way, e.g. a mixing chamber may be created. Hence, in a further embodiment one or more of the luminescent materials is configured as window of a mixing chamber, wherein the first solid state light source is configured to provide their solid state light source light in the mixing chamber, and wherein the solid state light source and the one or more luminescent materials are configured to provide lighting device light downstream from the luminescent material.

Good results are obtained when one of the luminescent materials is provided as ceramic and the other is embedded in a matrix. Especially good results are obtainable when the luminescent material of the class of M$_2$Si$_5$N$_8$:Eu is provided as ceramic body, especially arranged on the LED die, and the luminescent material of the class of MLiAl$_3$N$_4$:Eu is embedded in a matrix downstream or upstream of the ceramic body. Hence, in a further embodiment the first red luminescent material comprises a ceramic material (i.e. ceramic body) comprising a luminescent material of the class of M$_2$Si$_5$N$_8$:Eu, and the second red luminescent material comprises a luminescent material of the class of MLiAl$_3$N$_4$:Eu dispersed in a light transmissive matrix. In an embodiment, the matrix encloses a substantial part of the ceramic material. The term "light transmissive matrix" refers to a matrix material that is used as matrix for another material, and which matrix material (itself) has a relative high transmission for visible light, such as at least 85%, such at least 90%. The transmission or light permeability can be determined by providing light at a specific wavelength with a first intensity to the material and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989). The matrix material may comprise one or more materials selected from the group consisting of a transmissive organic material, such as selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethylene terephthalate (PET), (PETG) (glycol modified polyethylene terephthalate), PDMS (polydimethylsiloxane), and COC (cyclo olefin copolymer). However, in another embodiment matrix material may comprise an inorganic material. Preferred inorganic materials are selected from the group consisting of glasses, (fused) quartz, transmissive ceramic materials. Also hybrid materials, comprising both inorganic and organic parts may be applied, such as silicones. Especially preferred are PMMA, transparent PC, silicone, or glass as material for the matrix material.

In yet a further embodiment, the invention provides a sandwich structure with a first light source, especially solid state light source (die), and the ceramic body sandwiching a matrix layer comprising a luminescent material (the latter thus being provided directly on the light source (die)), especially a sandwich structure wherein the matrix layer at the edges may further be enclosed with an edge element, such as a reflective rim. The reflective rim may comprise a light scattering inorganic filler like titania or zirconia or boron nitride suspended in a silicone or expoxy or glass compound. Hence, the matrix layer may be substantially fully enclosed by the light source (die), the ceramic body and the edge element. Even more especially, the ceramic body comprises the luminescent material of the class of $M_2Si_5N_8$:Eu and the matrix layer comprises the luminescent material of the class of $MLiAl_3N_4$:Eu, with the matrix material being e.g. a silicone (glue). Further, especially the first light source comprises a solid state light source, especially a high power solid state light source (configured to provide blue light).

In yet a further aspect, the invention also provides a lighting unit configured to provide lighting unit light, the lighting unit comprising one or more lighting devices as defined herein. The lighting unit may be configured to provide red light or the lighting unit may be configured to provide (also) other types of light. In the latter embodiment(s) the lighting unit will in addition to the lighting device(s) as defined herein also include one or more other light sources and optionally also one or more other light converters (other than the first luminescent material and the second luminescent material).

In a specific embodiment, the lighting unit further comprising a second light source configured to generate second light source light and optionally a third light source configured to generate third light source light, wherein the second light source and the optional third light source are configured to provide one or more of blue light, green light, yellow light and UV light. When blue and green would be provided, an RGB-based lighting unit could be provided. When blue and yellow would be provided, a RYB-based lighting unit could be provided. When (also) a UV light source would be provided, this would in general be in combination with a further luminescent material, that is especially excitable by the UV light of the UV light source. Alternatively or additionally, the second light source light and optionally a third light source may be configured to provide one or more of orange light and deep red light (>650 nm, such as >660 nm).

Hence, in an embodiment the lighting unit further comprises a third luminescent material configured to convert at least part of one or more of the first light source light (i.e. especially remaining first light source light not converted by the first and second luminescent material), the second light source light and the optional third light source light into third luminescent material light.

Note that in general, but especially also in relation to the second light source and the optional third light source and the optional third luminescent material, these terms may each independently also refer to a plurality of (different) second light sources, a plurality of (different) optional third light sources and a plurality of (different) third luminescent materials, respectively.

In yet a further embodiment, the lighting unit further comprises a control unit configured to control the first light source, the second light source and the optional third light source independently. In this way, not only red light may be provided, but also other colors, such as for instance also white light, assuming that the lighting unit is configured to provide white light. The phrase "configured to provide white light" may indicate that the lighting unit is able to provide white light, but may also include embodiments wherein the lighting unit is controllable and is able to provide other colors of light. Hence, in an embodiment the lighting unit is configured to provide white lighting unit light.

In yet a further aspect, the invention also provides a converter element comprising (i) a first red luminescent material able to absorb at least part of a first light source light and to convert into first red luminescent material light having a first red emission peak wavelength ($\lambda$m1), (ii) a second red luminescent material also able to absorb at least part of said first light source light and to convert into second red luminescent material light having a second red emission peak wavelength ($\lambda$m2), wherein the first luminescent material and the second luminescent material are $Eu^{2+}$ based, and wherein $\lambda m1 < \lambda m2$. Especially, as indicated above the first red luminescent material has an excitation maximum ($\lambda$x1) and the second red luminescent material has a second excitation maximum ($\lambda$x2), with especially $\lambda x1 < \lambda x2$. Further, especially the first red luminescent material comprises a luminescent material of the class of $M_2Si_5N_8$:Eu and the second red luminescent material comprises a luminescent material of the class of $MLiAl_3N_4$:Eu. Even more especially, the first red luminescent material or the second luminescent material comprises a ceramic material comprising a luminescent material of the class of $M_2Si_5N_8$:Eu or of the class of $MLiAl_3N_4$:Eu, and the second red luminescent material comprises a luminescent material of the class of $MLiAl_3N_4$:Eu or of the class of $MLiAl_3N_4$:Eu dispersed in a light transmissive matrix. In a specific embodiment, as also indicated above, the first red luminescent material comprises a ceramic material (i.e. ceramic body) comprising a luminescent material of the class of $M_2Si_5N_8$:Eu, and the second red luminescent material comprises a luminescent material of the class of $MLiAl_3N_4$:Eu dispersed in a light transmissive matrix. Hence, in a specific embodiment the light transmissive matrix comprise a polymer, even more especially the light transmissive matrix comprises a silicone. Instead of or in addition to the above indicated $MLiAl_3N_4$:Eu class of materials and/or $M_2Si_5N_8$:Eu class of materials, one or more other red luminescent materials may be applied, such as of the class of MD:Eu (see also above). In yet a more specific embodiment, the luminescent material of the class of $MLiAl_3N_4$:Eu is dispersed in a light transmissive matrix configured downstream of the first light source and the ceramic material comprising a luminescent material of the class of $M_2Si_5N_8$:Eu is configured downstream of said the luminescent material of the class of $MLiAl_3N_4$:Eu dispersed in a light transmissive matrix. This may provide a sandwich structure, with the $MLiAl_3N_4$:Eu layer being sandwiched between the first light source and the ceramic material comprising the luminescent material of the class of $M_2Si_5N_8$:Eu. Such structure may add to the stability of the intermediate layer, for instance when such layer would be relatively vulnerable to oxygen and/or water (gas).

Such converter may e.g. comprise a multi-layer or a ceramic body or a laminate of ceramic bodies, or a polymer (such as silicone) matrix, etc., comprising the first red luminescent material and the second red luminescent material. In an embodiment, such converter can be arranged to the first light source (die). However, the converter may also be arranged at a distance from the first light source (die). Hence, the luminescent materials (and the converter) are radiationally coupled when configured in a lighting device or lighting unit. The term "radiationally coupled" especially means that the light source and the luminescent material are associated with each other so that at least part of the radiation emitted by the light source is received by the luminescent material (and at least partly converted into luminescence).

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Preferably, the light source is a light source that during operation emits (light source light) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light.

In a specific embodiment, the light source comprises a solid state LED light source (such as a LED or laser diode).

The term "light source" may also relate to a plurality of light sources, such as 2-20 (solid state) LED light sources. Hence, the term LED may also refer to a plurality of LEDs.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 540-570 nm. The terms "orange light" or "orange emission" especially relate to light having a wavelength in the range of about 570-600. The terms "red light" or "red emission" especially relate to light having a wavelength in the range of about 600-750 nm. The term "pink light" or "pink emission" refers to light having a blue and a red component. The terms "visible", "visible light" or "visible emission" refer to light having a wavelength in the range of about 380-750 nm.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1a-1c schematically depict some aspects of the invention. These schematic drawings are not necessarily on scale.

DETAILED DESCRIPTION OF THE EMBODIMENTS

Figure 1A:
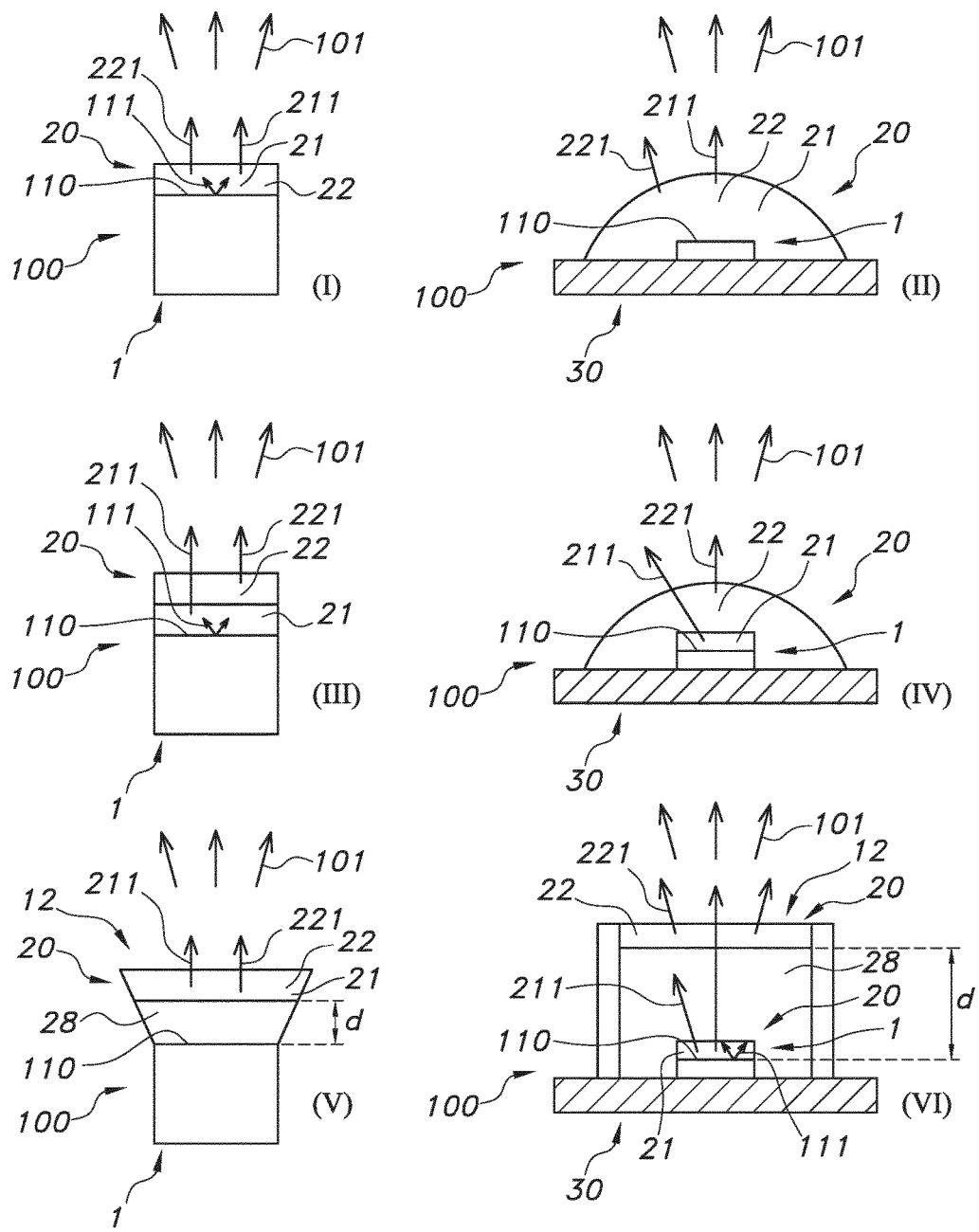

FIG. 1a schematically depicts a non-limiting number of embodiments of the lighting device 100 of the invention. Each lighting device 100 is configured to provide red lighting device light 101. The lighting device 100 comprises a first light source 1, here by way of example a solid state light source (LED), configured to provide first light source light 111 having a peak wavelength λls. Further, each lighting device 100 comprises a first red luminescent material 21 configured to absorb at least part of the first light source light 111 and to convert into first red luminescent material light 221 having a first red emission peak wavelength λm1, the first red luminescent material 21 having an excitation maximum λx1, as well as a second red luminescent material 22 configured to absorb at least part of the first light source light 111 and to convert into second red luminescent material light 221 having a second red emission peak wavelength λm2, the second red luminescent material 22 having a second excitation maximum λx2. The light escaping from the lighting device 100, which is indicated with reference 101, comprises thus said first red luminescent material light 221 and said second red luminescent material light 221. Optionally, this lighting device light 101 may also include light source light 111. Reference 110 indicates a LED die (i.e. the light emissive surface of a LED).

Six examples of lighting devices are shown. In example I, a converter, indicated with reference 20, comprises both luminescent materials 21,22. The converter may e.g. comprises a light transmissive matrix including both luminescent materials 21,22. In example II, the first luminescent material 21 and the second luminescent material are embedded in a dome or lens-like transparent matrix, e.g. silicone. In both examples I and II there is substantially no distance between the luminescent materials and the light source 1, especially its LED die 110. Reference 30 indicates a support, such as a PCB (printed circuit board).

In example III, two layers are provided, such as coatings or ceramic bodies, or polymeric matrices, or a coating and a ceramic body, or a ceramic body and a polymeric matrix, etc. Here, by way of example, the second luminescent material 22 is (more) remote from the light source 1, whereas the first luminescent material 21 may be in direct contact with the light emissive surface, here LED die 110, of the first light source 1. In Example IV substantially the same configuration as in example III is shown. However, now the second luminescent material 22 is embedded in a polymeric matrix, such as silicone, which may be provided in the shape of a lens or dome.

In example V, a device with a chamber 28 is shown. Both luminescent materials 21 and 22 are configured remote, here by way of example in a single converter layer. Reference 12 indicates a window. Further, downstream of the window 12, further optical elements may optionally be available (not shown). Here, the second red luminescent material 22 is configured as window. Note however that a window (material) may e.g. be also used as support for a coating (of one or more of the luminescent materials 21,22), etc. The distance (of the remote luminescent material to the light source 1) is indicated with reference d, which may e.g. in the range of 0.5-100 mm. Example VI shows a hybrid system of examples III and V, with a chamber 28 with one of the luminescent materials, here the second luminescent material 22, remote and the other luminescent material, here the first luminescent material 21, arranged on the light source 1.

Note however that much more embodiments are possible, including combinations of some of the above described examples. Further, the arrangement of the first luminescent material 21 and the second luminescent material 22 may also be the other way around. Further, optionally both luminescent materials 21,22 are arranged on both options depicted in examples III-VI.

FIG. 1b schematically depicts three non-limiting examples of the lighting unit 10 of the invention. Each lighting unit 10 is configured to provide lighting unit light 11. Each lighting unit 10 comprises one or more lighting devices 100 (here by way of example only one is schematically depicted). In these examples I-III, the lighting unit 10 further comprises a second light source 2 configured to generate second light source light 321 (examples I-III) and, and optionally a third light source 3 (example I) configured to generate third light source light 331, wherein the second light source 2 and the optional third light source 3 are configured to provide one or more of blue light, green light, yellow light, orange light, deep red light, and UV light. Reference 12 indicates a window, which may for instance include scattering material. However, such window may also include light direction elements. Further, downstream of the window 12 further optical elements may be available (not shown). In embodiments, the window may be configured as support for a coating.

In example I, for instance, the lighting device 100, comprising first light source 1, provides red lighting device light 101 (see also above for optional embodiments for this lighting device 100). The second light source 2 may e.g. be configured to provide blue light as second light source light 321 (and is therefore also indicated as light 111, as especially the first light source may provide blue light source light 111;

see FIG. 1a) and the third light source 3 may be configured to provide green light as third light source light 331. Hence, the first light source 1 and the second light source 2 might optionally be identical, with the former however the first light source light 111 substantially having converted into red lighting device light 101 by the luminescent materials (not shown in these examples; see for details e.g. FIG. 1a).

In example II, for instance, a combination of the lighting device and a blue LED ($2^{nd}$ light source) with yellow converter is schematically depicted. The second light source 2 is provide with a third converter 23, which may be configured to convert part of the (blue) second light source light 321 of the second light source 2 into yellow light. The light emission of the third converter 321 is indicated with reference 231 and indicates the third luminescent material light. The blue light source light 321 and the yellow third luminescent material light 231 may be used to provide white lighting unit light 11; the red lighting device light 101 may be used to tune the lighting unit light 11, e.g. to provide more warm white light. Hence, the lighting unit light 11 may, e.g. assuming white light, include blue second light source light 321 and yellow third luminescent material light 231, optionally also (some) blue first light source light, and optionally, e.g. dependent upon the desired color temperature, also red lighting device light 101.

In example III, for instance, substantially the same embodiment as in example II is depicted. However, now the third converter 23 is arranged remote.

Figure 1C:
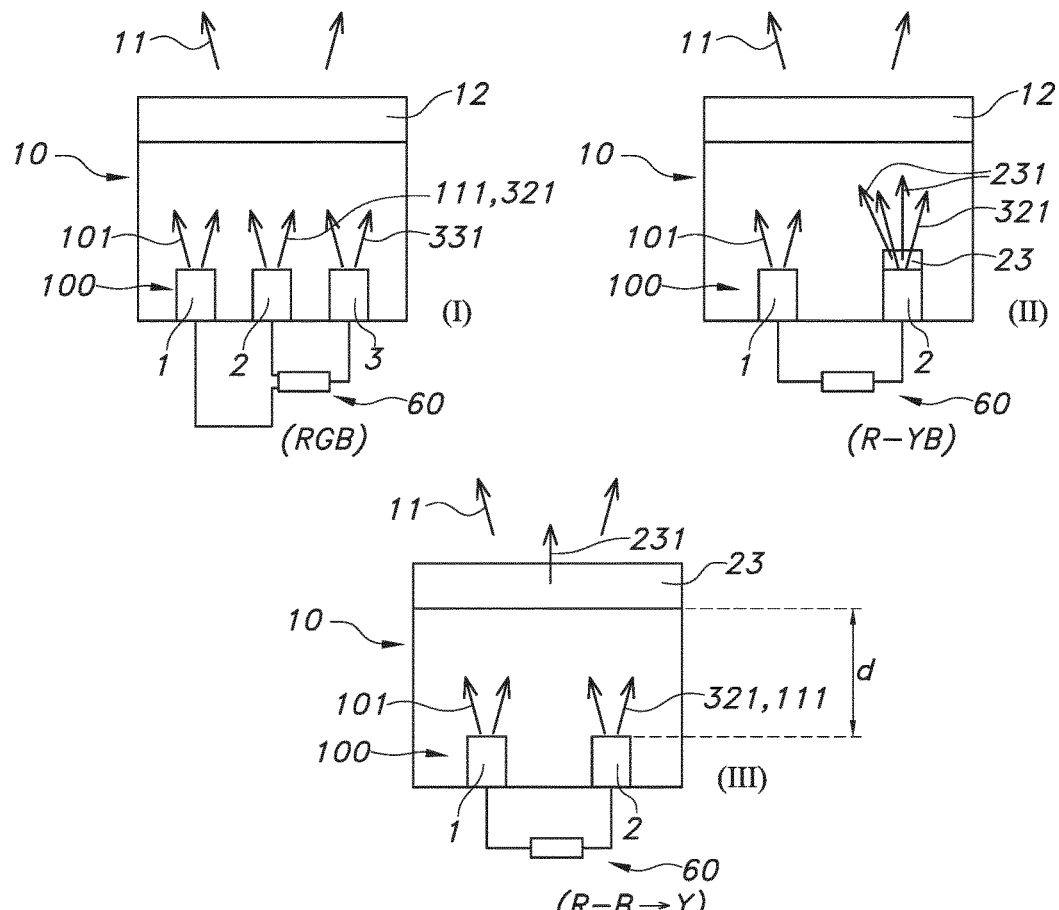
Figure 1C:
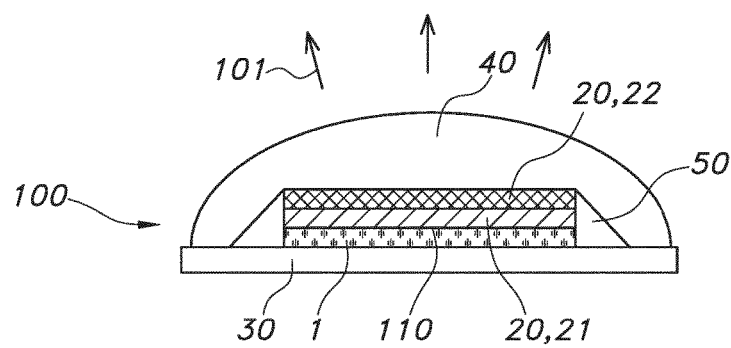

FIG. 1c schematically depicts in more detail an embodiment of the lighting device 100 as defined herein. Reference 40 indicates a lens (e.g. silicone, glass, plastic material, etc.). References 21 and 22 indicate the red phosphors, which may be provided as powder in silicone/glass/plastic material, as ceramic, as ceramic or glass with multilayer interference filter, etc. Here, by way of example two luminescent material layers, e.g. ceramic bodies, are provided as converter 20. Reference 110 indicates a blue die. Further, reference 30 indicates a mechanical support/socket. Further, reference 50 indicates a side coat or edge element, such as comprising a silicone, glass, plastic material, or epoxy resin, etc., with for instance one or more of a reflector material (titania, alumina, etc.), a thermal conduction support like crystobalite and/or alumina, optionally also one or more of the red phosphors, a protective layer against humidity, etc. However, such side coat or edge element is not necessarily available. Note that the lens or dome 40 encloses a substantial part of the converter, here the ceramic materials. FIG. 1c especially shows an embodiment wherein the invention provides a sandwich structure with first light source 1, especially solid state light source (die 110), and the ceramic body sandwiching a matrix layer comprising a luminescent material (the latter thus being provided directly on the light source (die 110)), especially a sandwich structure wherein the matrix layer at the edges may further be enclosed with an edge element 50, such as a reflective rim. Hence, the matrix layer may be substantially fully enclosed by the light source (die), the ceramic body and the edge element. Even more especially, the ceramic body comprises the luminescent material of the class of $M_2Si_5N_8$:Eu and the matrix layer comprises the luminescent material of the class of $MLiAl_3N_4$:Eu, with the matrix material being e.g. a silicone (glue). Further, especially the first light source comprises a solid state light source, especially a high power solid state light source (configured to provide blue light). Hence, in an embodiment the luminescent material of the class of $MLiAl_3N_4$:Eu is dispersed in a light transmissive matrix configured downstream of the first light source 1 and the ceramic material comprising a luminescent material of the class of $M_2Si_5N_8$:Eu is configured downstream of said the luminescent material of the class of $MLiAl_3N_4$:Eu dispersed in a light transmissive matrix.

Figure 2A:
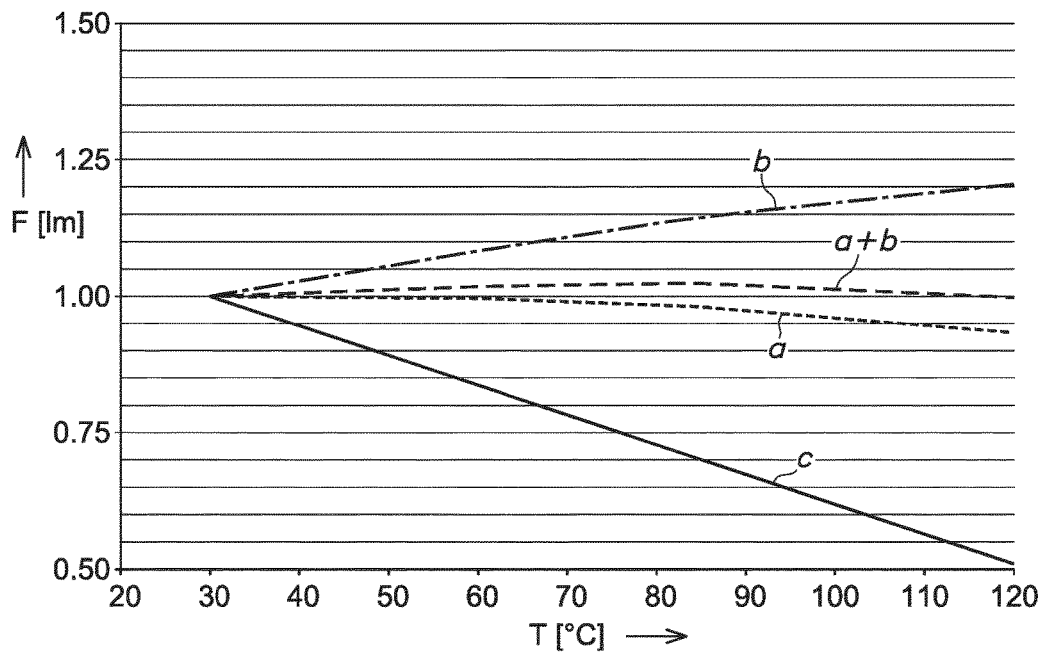
FIG. 2a shows the flux stability with temperature of amongst others a combination of phosphors as defined herein, with on the x-axis the socket temperature in ° C. and on the y-axis the relative flux (F) in lumen (Lm), for a first red luminescent material (a), a second luminescent material (b), the combination of the two luminescent materials (a+b) and a for comparison a red AlInGaP LED (c)

In FIG. 2a the emitted flux normalized to the flux at 30° C. socket temperature as a function of socket temperature is shown. The normalized flux (F) is indicated on the y-axis (lumen). For a direct emitting AlInGaP LED (line c) the flux loss with temperature is evident. At 120° C. it is >40% whereas for the mixture (dashed line: a+b) of two dedicated red converting phosphors (a,b) the emitted flux is almost constant as a function of temperature. In these examples, the first phosphor material comprises $(Ba,Sr,Ca)_2Si_{5-x}Al_xO_xN_{8-x}$:Eu (herein also indicated as luminescent material a or phosphor a) in dense sintered ceramic form and the second phosphor material comprises $(Sr,Ba)LiAl_3N_4$:Eu (herein also indicated as luminescent material b or phosphor b) in powder form suspended in a silicone matrix.

Figure 2B:
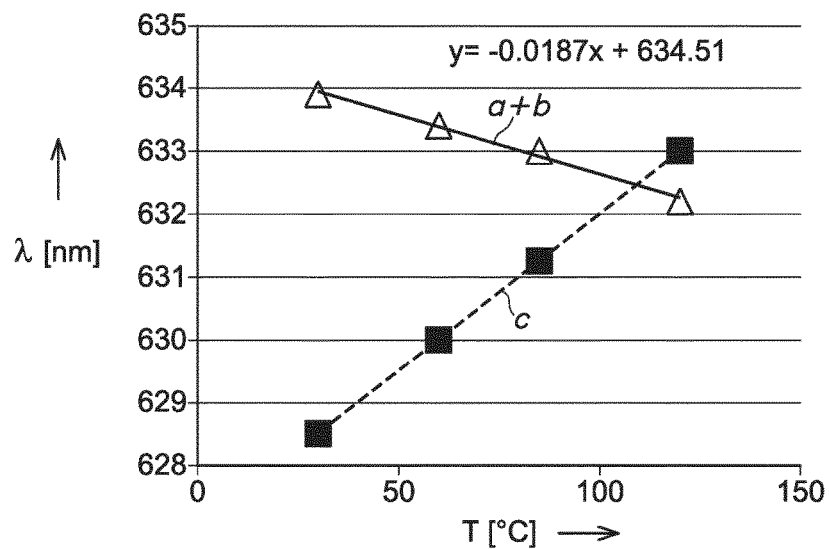
FIG. 2b shows the centroid wavelength shift with temperature, with on the x-axis the socket temperature in ° C. and on the y-axis the centroid wavelength (nm) for a red LED (c) and the same combination of luminescent materials (a+b)

FIG. 2b shows how the centroid wavelength (CW) for a direct red emitting LED (AlInGaP) and the mixture of red emitting phosphors according to the invention vary with temperature. Typically for a 627 nm direct red emitting AlInGaP LED the CW varies with a temperature coefficient of 0.05 nm/° C. The CW of the luminescent material mixture (a+b) is typically in the range of 630 nm to 640 nm with a temperature coefficient of –0.02 nm/° C., this translates into a more stable color point and into temperature independent flux. In FIG. 2b, the centroid wavelength calculation is made for the emission spectra of FIG. 2F and also includes the remaining blue light in the spectrum. This is an exception; when the centroid wavelength of the two red emissions is to be determined, this only relates to the red emission. In FIG. 2b however, the centroid wavelength is compared between a red LED and a device according to the invention. For the sake of comparison, the small blue contribution is not a problem. It is clear that the device of the invention is much less dependent from the temperature than the red LED.

The emission spectrum of $Eu^{2+}$ activated phosphors shifts to shorter wavelength with increasing temperature. In order to compensate this effect a mixture of two red phosphors is applied on a blue LED, which consists of a first phosphor e.g. emitting at a first peak wavelength λ1 e.g. in the range 600-630 nm with e.g. an absorption maximum<440 nm and a second phosphor emitting at a second wavelength e.g. λ2>630 nm and e.g. an absorption maximum>440 nm. For a blue LED emitting in the range of 430 to 460 nm, the emission spectrum shifts to longer wavelength with increasing socket temperature (herein also indicated as base temperature) (FIG. 2c, Table 1).

TABLE 1 peak and centroid wavelength (CW) of a blue LED for different temperatures

| Base temperature [° C.] | Peak wavelength [nm] | Centroid wavelength [nm] |
| --- | --- | --- |
| 30 | 452.3 | 454.5 |
| 60 | 453.5 | 455.4 |
| 85 | 454.7 | 456.3 |
| 120 | 456.5 | 457.9 |

Figure 2C:
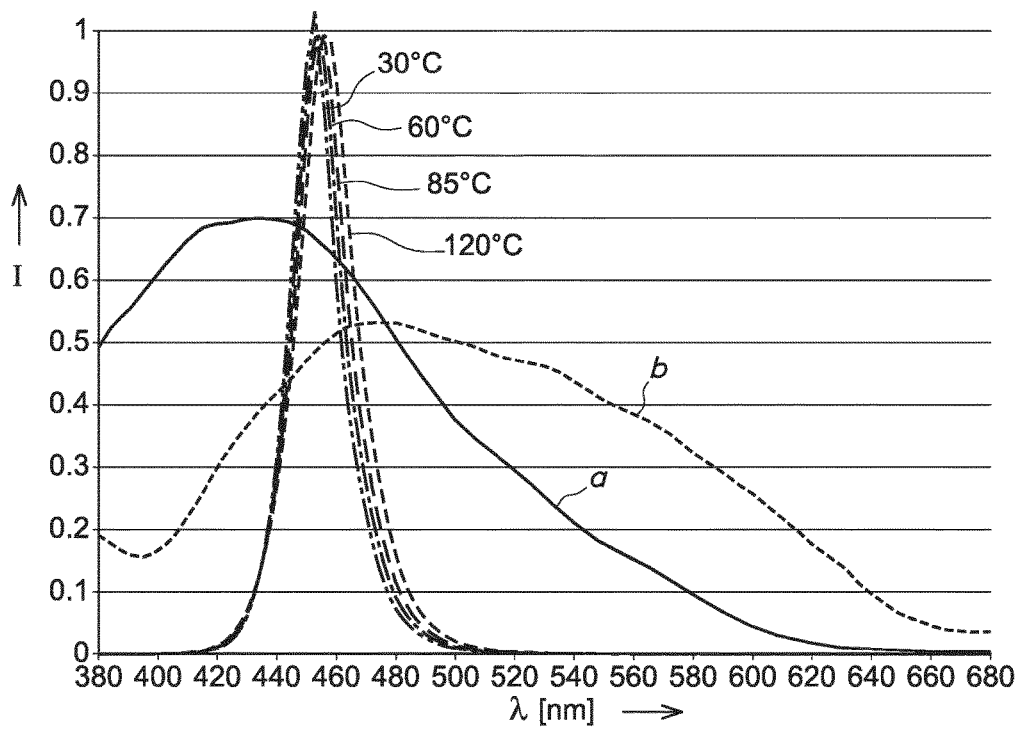
FIG. 2c shows the absorption (in fact here substantially identical to the excitation (arbitrary units on the y-axis)) of red phosphors (a/b) and blue emission shift behavior of a blue LED at different temperatures, indicated in the drawing. The emission is normalized to 1 (intensity in arbitrary units). The x-axis indicates the wavelength (nm)

The peak wavelengths of the blue LED in table 1 correspond thus with the maxima in FIG. 2c.

Figure 2D:
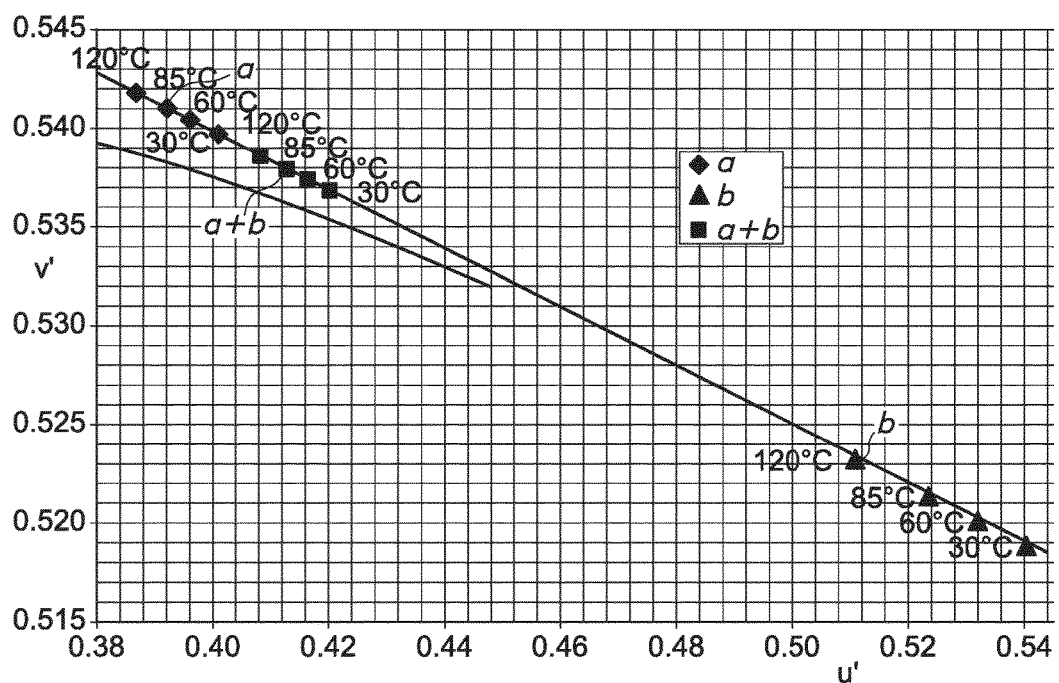
FIG. 2d shows the color point shift of the saturated color points with temperature in the CIE 1976 chromaticity chart, with the diamonds indicating the first luminescent material (a), the triangles indicating the second luminescent material (b), and the squares indicating the combination (a+b) of the luminescent materials.

Thus with increasing temperature, the conversion for the first red phosphor decreases and the conversion with the second red phosphor (with longer wavelength) increases (FIG. 2c), and the change in red flux and color point of the phosphor converted LED is reduced as shown in FIG. 2d. FIG. 2c shows a combination of two red luminescent materials (($Ba,Sr,Ca)_2Si_{5-x}Al_xO_xN_{8-x}$:Eu (a) and $(Sr,Ba)LiAl_3N_4$:Eu (b), one having a shorter wavelength maximum than the other, and both having an excitation maximum close to the light source emission, but the first luminescent material having an excitation maximum at a wavelength shorter than the excitation maximum, and the second luminescent material having an excitation maximum at a wavelength longer than the excitation maximum. The maxima described here relate to the peak wavelength. The shift of the saturated color points is also positively influenced by mixing the two red phosphors. Referring to FIG. 2c it appears that the red luminescent materials excitations substantially overlap with the emission wavelength distribution of the first light source.

In FIG. 2d it is obvious, that the mixture is less shifting with temperature compare to the single phosphors. In Table 2 the maximum color point shift from 30° C. to 120° C. is tabulated.

TABLE 2

| | color point shift | |
|---|---|---|
| | Δu' | Δu'v' |
| red phosphor 1 | 0.014 | 0.014 |
| red phosphor 2 | 0.029 | 0.030 |
| Mixture | 0.012 | 0.012 |

Figure 2E:
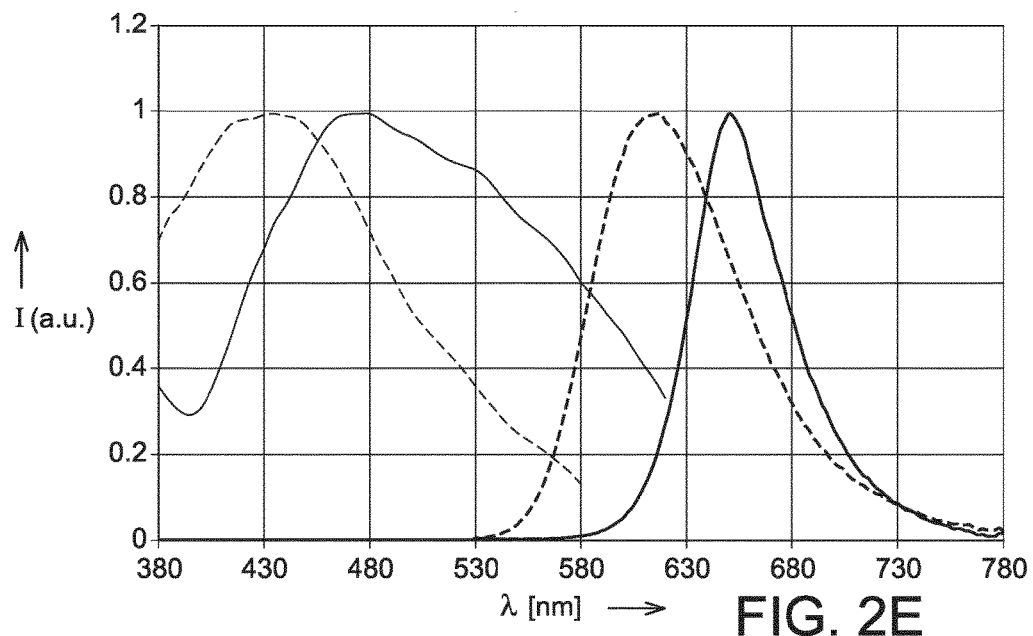
FIG. 2e shows excitation and emission spectra of the red luminescent materials of which date are also displayed in FIGS. 2a-2d.
Figure 2F:
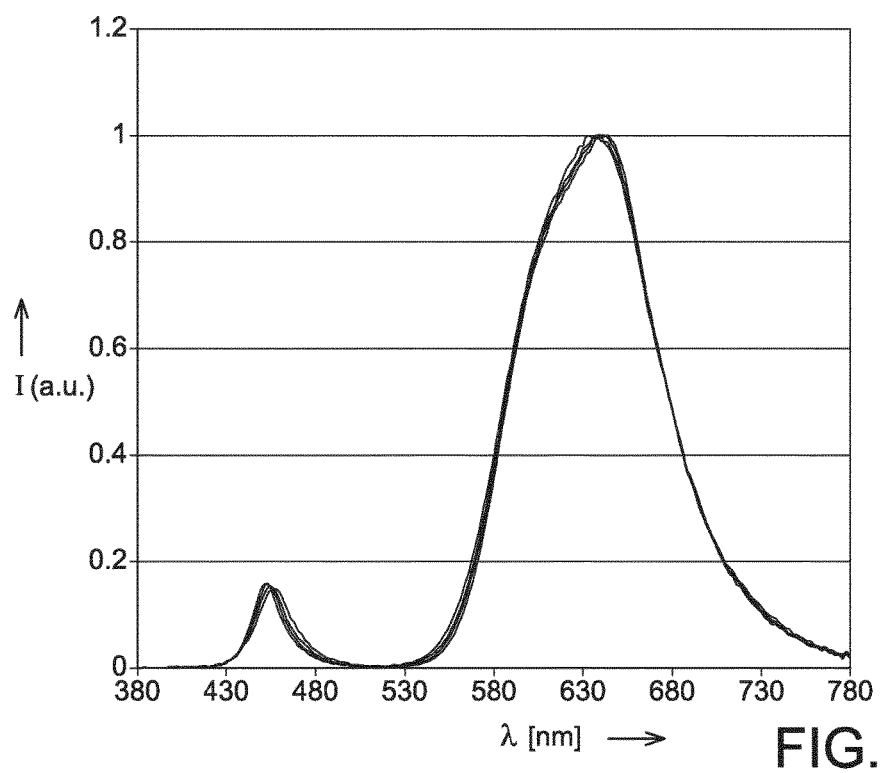
FIG. 2f shows emission spectra of the same combination of luminescent materials at 30, 60, 85 and 120° C.

FIG. 2e shows in a single graph the excitation spectra and emission spectra of the two red luminescent materials. The respective excitation peak wavelengths are found at 435 and 480 nm and are of the luminescent materials a and b, respectively (see also FIG. 2c); the respective emission peak (centroid) wavelengths are found at 616 (632) nm and 650 (662) nm, also of the luminescent materials a and b, respectively. A combination of the emissions on a blue LED as function of the temperature with on the y-axis intensity in arbitrary units is indicated in FIG. 2f. The centroid wavelength of the combination of these red luminescent materials are found at 640.9 nm, 640.6 nm, 640.2 nm, and 639.6 nm (in the order of increasing temperature), respectively. The from this graph 2f indicated centroid wavelengths are only based on the red emission, and not on the remaining blue emission in the graph. Hence, the centroid wavelength is evaluated in a range of about 510-800 nm.

The invention claimed is:

1. A lighting device configured to provide red lighting device light, the lighting device comprising:
    a first light source configured to provide first light source light having a peak wavelength ($\lambda ls$);
    a first red luminescent material configured to absorb at least part of the first light source light and to convert into first red luminescent material light having a first red emission peak wavelength ($\lambda m1$), the first red luminescent material having an excitation maximum ($\lambda x1$);
    a second red luminescent material configured to absorb at least part of the first light source light and to convert into second red luminescent material light having a second red emission peak wavelength ($\lambda x2$), the second red luminescent material having a second excitation maximum ($\lambda x2$);
    wherein the first luminescent material and the second luminescent material are $Eu^{2+}$ based, and wherein $\lambda m1 < \lambda m2$, $\lambda x1 < \lambda ls$ and $\lambda x2 > \lambda ls$,
    wherein the first red luminescent material comprises a ceramic material comprising a luminescent material of the class of $M_2Si_5N_8$:Eu,
    wherein the second red luminescent material comprises a luminescent material of the class of $MLiAl_3N_4$:Eu dispersed in a light transmissive matrix,
    wherein the second red luminescent material is configured downstream of the first light source,
    wherein the first red luminescent material is configured upstream or downstream of the second red luminescent material, and
    wherein M is independently selected from the group consisting of Ca, Mg, Sr, and Ba.

2. The lighting device of claim 1, wherein $\lambda ls$ is selected from within a range of about 430 nm to about 470 nm, wherein $\lambda m1$ is selected from within a range of about 590 nm to about 630 nm, and wherein $\lambda m2$ is selected from within a range of about 615 nm to about 660 nm.

3. The lighting device of claim 1, wherein $\lambda ls$ is selected from within a range of about 435 nm to about 465 nm, wherein $\lambda m1$ is selected from within a range of about 600 nm to about 630 nm, and wherein $\lambda m2$ is selected from within a range of about 625 nm to about 660 nm.

4. The lighting device of claim 1, wherein the first red luminescent material and the second red luminescent material are selected from the group consisting of $(Ba,Sr,Ca)_2Si_{5-x} Al_xN_{8-x}O_x$:Eu, wherein x is in a range of about 0 to about 4, and $(Ba,Sr)LiAl_3N_4$:Eu.

5. The lighting device of claim 1, wherein the first red luminescent material comprises $(Sr,Ca)_2Si_5N_8$:Eu, and wherein the second red luminescent material comprises $SrLiAl_3N_4$:Eu.

6. The lighting device of claim 1, configured as a lighting unit to provide lighting unit light.

7. The lighting unit of claim 6, further comprising a second light source configured to generate second light source light, wherein the second light source are is configured to provide one or more of blue light, or green light, or yellow light or UV light.

8. The lighting unit of claim 7, further comprising a control unit configured to control the first light source, and the second light source independently.

9. The lighting unit of claim 7, configured to provide white lighting unit light.

10. The lighting unit of claim 7, further comprising a third light source configured to generate third light source light, wherein the third light source is configured to provide one or more of blue light, or green light, or yellow light or UV light.

11. The lighting unit of claim 10, further comprising a third luminescent material configured to convert at least part of one or more of the first light source light, the second light source light or the third light source light into third luminescent material light.

12. The lighting unit of claim 10, further comprising a control unit configured to control the first light source, the second light source and the third light source independently.

13. The lighting unit of claim 6, further comprising a backlighting unit of a liquid crystal display (LCD) device.

14. The lighting device of claim 1, further comprising at least a portion of a projection system.

15. The lighting device of claim 1, further comprising at least a portion of a self-lit display system.

16. The lighting device of claim 1, further comprising at least a portion of a projection system.

17. The lighting device of claim 1, further comprising at least a portion of a pixelated display system.

18. A converter element comprising
a first red luminescent material to absorb at least part of a first light source light and to convert into first red luminescent material light having a first red emission peak wavelength ($\lambda m1$), the first red luminescent material having an excitation maximum ($\lambda x1$);
a second red luminescent material to absorb at least part of said first light source light and to convert into second red luminescent material light having a second red emission peak wavelength ($\lambda m2$), the second red luminescent material having a second excitation maximum ($\lambda x2$);
wherein the first luminescent material and the second luminescent material are $Eu^{2+}$ based, and wherein $\lambda m1 < \lambda m2$, $\lambda x1 < \lambda ls$ and $\lambda x2 > \lambda ls$,
wherein the first red luminescent material comprises a ceramic material comprising a luminescent material of the class of $M_2Si_5N_8$:Eu,
wherein the second red luminescent material comprises a luminescent material of the class of $MLiAl_3N_4$:Eu dispersed in a light transmissive matrix,
wherein the second red luminescent material is configured downstream of the first light source,
wherein the first red luminescent material is configured upstream or downstream of said second red luminescent material, and
wherein M is independently selected from the group consisting of Ca, Mg, Sr, and Ba.

19. The converter element of claim 18, wherein the light transmissive matrix comprise a polymer.

20. The converter element of claim 19, wherein the light transmissive matrix comprises a silicone.

* * * * *